United States Patent
Mazzola et al.

(10) Patent No.: US 12,538,809 B2
(45) Date of Patent: Jan. 27, 2026

(54) METHOD OF MANUFACTURING SEMICONDUCTOR DEVICES AND CORRESPONDING SEMICONDUCTOR DEVICE

(71) Applicant: STMicroelectronics S.r.l., Agrate Brianza (IT)

(72) Inventors: Mauro Mazzola, Calvenzano (IT); Fabio Marchisi, Milan (IT)

(73) Assignee: STMicroelectronics S.r.l, Agrate Brianza (IT)

( * ) Notice: Subject to any disclaimer, the term of this patent is extended or adjusted under 35 U.S.C. 154(b) by 447 days.

(21) Appl. No.: 18/102,147

(22) Filed: Jan. 27, 2023

(65) Prior Publication Data
US 2023/0245994 A1 Aug. 3, 2023

(30) Foreign Application Priority Data
Feb. 1, 2022 (IT) .......................... 102022000001646

(51) Int. Cl.
*H01L 23/00* (2006.01)
*H01L 23/495* (2006.01)

(52) U.S. Cl.
CPC ........ *H01L 24/40* (2013.01); *H01L 23/49513* (2013.01); *H01L 23/4952* (2013.01);
(Continued)

(58) Field of Classification Search
CPC ... H01L 24/92; H01L 23/49513; H01L 24/83; H01L 24/40; H01L 24/32; H01L 24/84;
(Continued)

(56) References Cited

U.S. PATENT DOCUMENTS 6,580,161 B2 * 6/2003 Kobayakawa ...... H01L 23/3107
257/676
9,184,148 B2 * 11/2015 Jeon ........................ H01L 24/16
(Continued)

FOREIGN PATENT DOCUMENTS

CN 101447469 A 6/2009
CN 219917157 U 10/2023
(Continued)

OTHER PUBLICATIONS

IT Search Report and Written Opinion for priority application, IT Appl. No. 102022000001646, report dated Aug. 29, 2022, 15 pgs.
(Continued)

*Primary Examiner* — Mouloucoulaye Inoussa
(74) *Attorney, Agent, or Firm* — Crowe & Dunlevy LLC

(57) ABSTRACT

A semiconductor device semiconductor chip mounted to a leadframe that includes an electrically conductive pad. An electrically conductive clip is arranged in a bridge-like position between the semiconductor chip and the electrically conductive pad. The electrically conductive clip is soldered to the semiconductor chip and to the electrically conductive pad via soldering material applied at coupling surfaces facing towards the semiconductor chip and the electrically conductive pad. The device further includes a pair of complementary positioning formations formed by a cavity in the electrically conductive clip and a protrusion (such as a stud bump or a stack of stud bumps) formed in the electrically conductive pad. The complementary positioning formations are mutually engaged to retain the electrically conductive clip in the bridge-like position to avoid displacement during soldering.

9 Claims, 2 Drawing Sheets

(52) U.S. Cl.
CPC .............. *H01L 24/32* (2013.01); *H01L 24/73* (2013.01); *H01L 24/83* (2013.01); *H01L 24/84* (2013.01); *H01L 24/92* (2013.01); H01L 2224/32245 (2013.01); H01L 2224/40177 (2013.01); H01L 2224/40505 (2013.01); H01L 2224/73263 (2013.01); H01L 2224/83 (2013.01); H01L 2224/84801 (2013.01); H01L 2224/92246 (2013.01)

(58) Field of Classification Search
CPC ..... H01L 24/73; H01L 23/4952; H01L 24/37; H01L 24/744; H01L 24/77; H01L 24/49; H01L 24/35; H01L 21/4842; H01L 24/41; H01L 23/495; H01L 24/85; H01L 24/29; H01L 23/49562; H01L 23/49524; H01L 23/3107; H01L 23/49575; H01L 24/81; H01L 24/14; H01L 25/074; H01L 2224/49171; H01L 2224/73263; H01L 2224/49175; H01L 2224/84138; H01L 2224/40505; H01L 2224/48137; H01L 2224/37147; H01L 2224/40245; H01L 2224/84385; H01L 2224/83; H01L 2224/48247; H01L 2224/32245; H01L 2224/40177; H01L 2224/29118; H01L 2224/40095; H01L 2224/83192; H01L 2224/37011; H01L 2224/4007; H01L 2224/37013; H01L 2924/3512; H01L 2224/84801; H01L 2924/15747; H01L 2224/04026; H01L 2224/49113; H01L 2224/83801; H01L 2924/1426

See application file for complete search history.

(56) References Cited

U.S. PATENT DOCUMENTS

| | | | | |
|---|---|---|---|---|
| 2002/0066963 | A1* | 6/2002 | Embong | H01L 24/84 |
| | | | | 257/784 |
| 2002/0096756 | A1* | 7/2002 | Kobayakawa | H01L 24/37 |
| | | | | 257/E23.044 |
| 2002/0125562 | A1* | 9/2002 | Crowley | H01L 23/49524 |
| | | | | 257/E23.044 |
| 2003/0075785 | A1* | 4/2003 | Crowley | H01L 24/40 |
| | | | | 257/676 |
| 2006/0110856 | A1* | 5/2006 | Kasem | H01L 23/49524 |
| | | | | 257/E23.044 |
| 2007/0284703 | A1 | 12/2007 | Wu et al. | |
| 2007/0290336 | A1* | 12/2007 | Sun | H01L 24/37 |
| | | | | 257/E23.044 |
| 2008/0173991 | A1* | 7/2008 | Cruz | H01L 23/49524 |
| | | | | 257/676 |
| 2009/0121331 | A1 | 5/2009 | Cruz | |
| 2011/0008936 | A1* | 1/2011 | Tellkamp | H05K 3/3426 |
| | | | | 438/123 |
| 2012/0119343 | A1* | 5/2012 | Bayan | H01L 21/4842 |
| | | | | 257/676 |
| 2013/0127029 | A1 | 5/2013 | Lee et al. | |
| 2014/0264804 | A1* | 9/2014 | Terrill | H01L 24/36 |
| | | | | 257/676 |
| 2015/0214139 | A1 | 7/2015 | Miyakawa | |
| 2015/0221582 | A1* | 8/2015 | Miyakawa | H01L 24/83 |
| | | | | 257/676 |
| 2016/0336257 | A1* | 11/2016 | Choi | H01L 24/40 |
| 2016/0358843 | A1* | 12/2016 | Arokiasamy | H01L 24/84 |
| 2017/0012012 | A1* | 1/2017 | Camenforte, III | H01L 21/4853 |
| 2017/0207150 | A1* | 7/2017 | Choi | H01L 24/72 |
| 2017/0250125 | A1* | 8/2017 | Arokiasamy | H01L 24/40 |
| 2017/0278774 | A1* | 9/2017 | Hayashi | H01L 23/49562 |
| 2018/0240770 | A1* | 8/2018 | Choi | H01L 23/4334 |
| 2018/0331022 | A1* | 11/2018 | Qin | H01L 23/49524 |
| 2019/0189545 | A1* | 6/2019 | Boettcher | H01L 23/49524 |
| 2020/0144162 | A1* | 5/2020 | Chaowasakoo | H01L 23/49517 |
| 2020/0203264 | A1 | 6/2020 | Ziglioli | |
| 2020/0211937 | A1* | 7/2020 | Saito | H01L 23/49524 |
| 2020/0227279 | A1* | 7/2020 | Umeda | H01L 24/84 |
| 2021/0013170 | A1* | 1/2021 | Kamiyama | H01L 24/37 |
| 2021/0090980 | A1* | 3/2021 | Noquil | H01L 23/49575 |
| 2021/0183751 | A1 | 6/2021 | Clemente et al. | |
| 2021/0202269 | A1* | 7/2021 | Baello | H01L 23/49861 |
| 2021/0265243 | A1* | 8/2021 | Kuraya | H01L 24/744 |
| 2022/0028762 | A1* | 1/2022 | Chaowasakoo | H01L 23/3128 |
| 2022/0115308 | A1* | 4/2022 | Noquil | H01L 23/49575 |
| 2022/0352056 | A1* | 11/2022 | Bajuri | H01L 24/77 |
| 2023/0170322 | A1 | 6/2023 | Rafael, Jr. et al. | |
| 2023/0245955 | A1 | 8/2023 | Mazzola et al. | |
| 2023/0245994 | A1 | 8/2023 | Mazzola et al. | |
| 2024/0170375 | A1* | 5/2024 | Tsukuda | H01L 23/49551 |
| 2024/0178179 | A1 | 5/2024 | Mazzola | |

FOREIGN PATENT DOCUMENTS

| | | |
|---|---|---|
| EP | 4220692 A1 | 8/2023 |
| EP | 4220693 A1 | 8/2023 |
| JP | 2002110750 A | 4/2002 |
| JP | 2015142072 A | 8/2015 |
| WO | 2007052199 A1 | 5/2007 |

OTHER PUBLICATIONS

CN First Office Action and Search Report for counterpart CN Appl. No. 202310048484.6, report dated Jun. 25, 2025, 6 pgs.

* cited by examiner

METHOD OF MANUFACTURING SEMICONDUCTOR DEVICES AND CORRESPONDING SEMICONDUCTOR DEVICE

PRIORITY CLAIM

This application claims the priority benefit of Italian Application for Patent No. 102022000001646 filed on Feb. 1, 2022, the content of which is hereby incorporated by reference in its entirety to the maximum extent allowable by law.

TECHNICAL FIELD

The description relates to semiconductor devices. One or more embodiments can be applied advantageously to power semiconductor devices.

BACKGROUND

Various types of semiconductor devices with a plastic package comprise: a substrate (leadframe) having one or more semiconductor integrated circuit chips or dice arranged thereon; electrically conductive formations (wires, ribbons, clips) coupling the semiconductor chip(s) to leads (outer pads) in the substrate; and an insulating encapsulation (e.g., a resin) molded on the assembly thus formed to complete the plastic body of the device.

In a power semiconductor device, the current transferred from the high-power section to the output pads of the device can be significant and ribbons or clips are used for that purpose in the place of wires. Wires can still be used to provide electrical coupling to a low-power section (e.g., a controller) in the device. Ribbons are placed using essentially a wire bonding process. Clips are placed with a clip attach equipment, and a solder paste is used to connect the clip to pad and die. Solder curing in an oven is applied to provide a solid connection of clips to pad and die.

Conventional clip attachment equipment facilitates achieving an adequate accuracy in chip placement as the clip is applied on die and pad, after which the assembly is transferred to an oven for solder curing. During this handling and curing process, clips may become displaced from a desired correct position. This may result in a defective final product. Solder thickness and the tendency of the clip to "float" on solder in a fluid state may also lie at the basis of undesired excessive clip tilt.

There is a need in the art to contribute to adequately addressing the issues discussed in the foregoing.

SUMMARY

One or more embodiments may relate to a method.

One or more embodiments may relate to a corresponding semiconductor device.

One or more embodiments may provide one or more of the following advantages: accurate clip positioning is facilitated throughout the assembly process with undesired movement (e.g., rotation) effectively countered; and solder thickness can be adequately controlled.

In an embodiment, a method comprises: arranging at least one semiconductor chip on a die pad in a substrate, the substrate comprising at least one electrically conductive pad by the die pad; positioning at least one electrically conductive clip in a bridge-like position between the at least one semiconductor chip and the at least one electrically conductive pad, wherein, in said bridge-like position, the at least one electrically conductive clip has coupling surfaces facing towards the at least one semiconductor chip and the at least one electrically conductive pad; and soldering the at least one electrically conductive clip in said bridge-like position to the at least one semiconductor chip and to the at least one electrically conductive pad to provide electrical coupling therebetween, wherein soldering is via soldering material at said coupling surfaces. The method further comprises, prior to positioning the at least one electrically conductive clip in a bridge-like position between the at least one semiconductor chip and the at least one electrically conductive pad, providing at least one pair of complementary positioning formations including a cavity in the at least one electrically conductive clip and a protrusion in at least one of the at least one semiconductor chip and the at least one electrically conductive pad, wherein, with the at the least one electrically conductive clip in said bridge-like position, the complementary positioning formations are mutually engaged and maintain the at least one electrically conductive clip in said bridge-like position during said soldering.

In an embodiment, a device comprises: at least one semiconductor chip on a die pad in a substrate, the substrate comprising at least one electrically conductive pad by the die pad; at least one electrically conductive clip positioned in a bridge-like position between the at least one semiconductor chip and the at least one electrically conductive pad, the at least one electrically conductive clip having coupling surfaces facing towards the at least one semiconductor chip and the at least one electrically conductive pad; solder material applied at said coupling surfaces of the at least one electrically conductive clip in said bridge-like position, the solder material electrically coupling the at least one electrically conductive clip to the at least one semiconductor chip and to the at least one electrically conductive pad; and at least one pair of complementary positioning formations including a cavity in the at least one electrically conductive clip and a protrusion in at least one of the at least one semiconductor chip and the at least one electrically conductive pad, the complementary positioning formations being mutually engaged.

BRIEF DESCRIPTION OF THE DRAWINGS

One or more embodiments will now be described, by way of example only, with reference to the annexed figures, wherein.

DETAILED DESCRIPTION

Corresponding numerals and symbols in the different figures generally refer to corresponding parts unless otherwise indicated.

The figures are drawn to clearly illustrate the relevant aspects of the embodiments and are not necessarily drawn to scale.

The edges of features drawn in the figures do not necessarily indicate the termination of the extent of the feature.

In the ensuing description one or more specific details are illustrated, aimed at providing an in-depth understanding of examples of embodiments of this description. The embodiments may be obtained without one or more of the specific details, or with other methods, components, materials, etc. In other cases, known structures, materials, or operations are not illustrated or described in detail so that certain aspects of embodiments will not be obscured.

Reference to "an embodiment" or "one embodiment" in the framework of the present description is intended to indicate that a particular configuration, structure, or characteristic described in relation to the embodiment is comprised in at least one embodiment. Hence, phrases such as "in an embodiment" or "in one embodiment" that may be present in one or more points of the present description do not necessarily refer to one and the same embodiment.

Moreover, particular conformations, structures, or characteristics may be combined in any adequate way in one or more embodiments.

The headings/references used herein are provided merely for convenience and hence do not define the extent of protection or the scope of the embodiments.

For simplicity and ease of explanation, throughout this description, like parts or elements are indicated in the various figures with like reference signs, and a corresponding description will not be repeated for each and every figure.

In current manufacturing processes of semiconductor devices, plural devices are manufactured concurrently to be separated into single individual device in a final singulation. For simplicity and ease of explanation, the following description will refer to manufacturing a single device.

Figure 1:
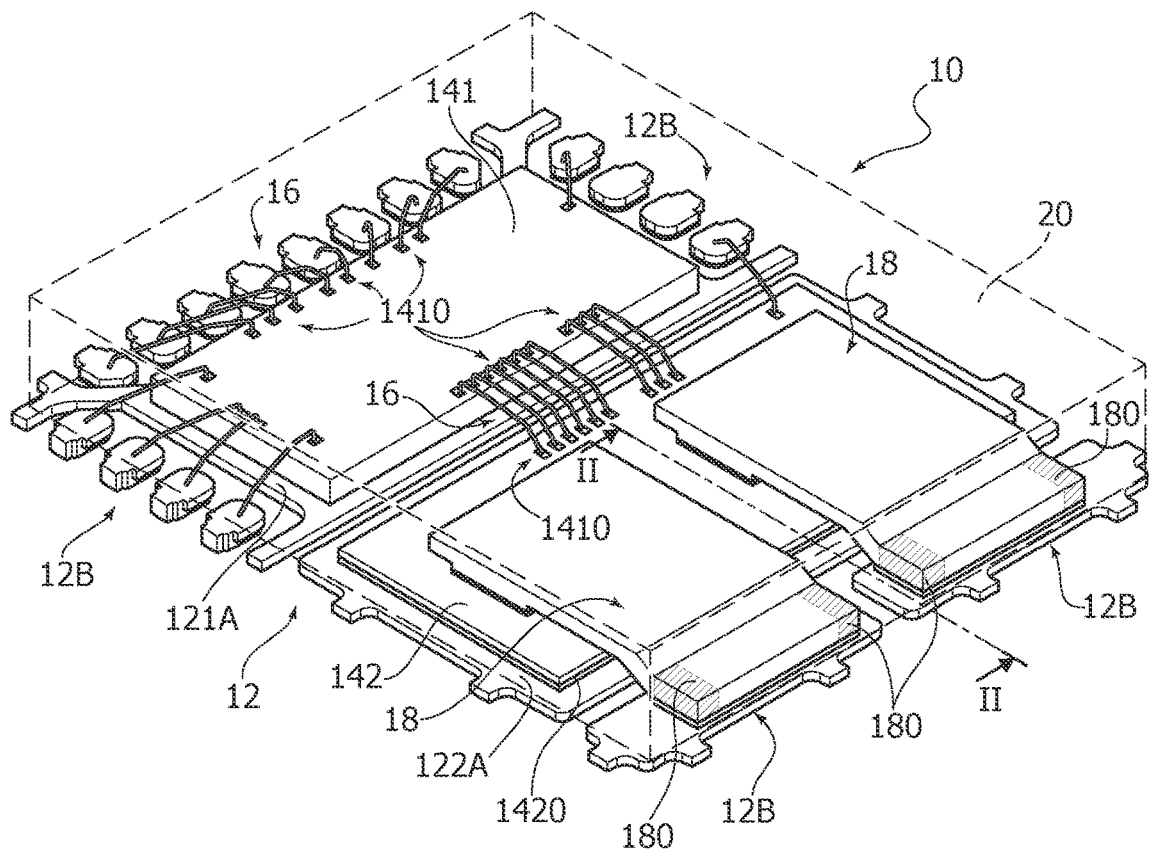
FIG. 1 is a perspective view of a power semiconductor device.
Figure 2:
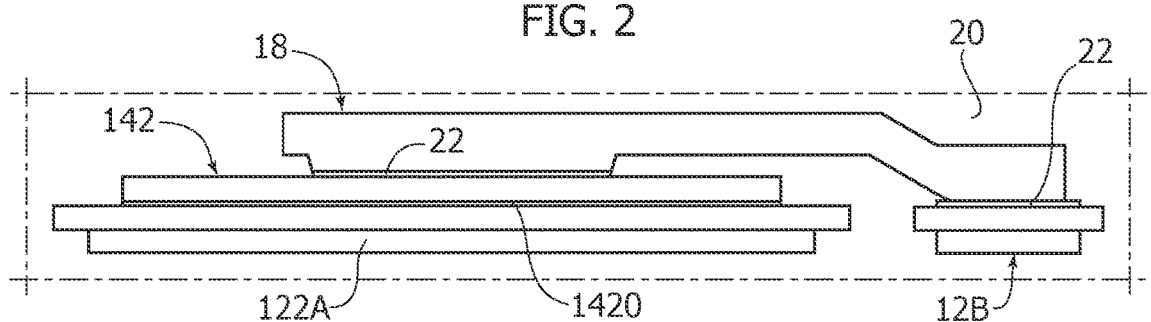
FIG. 2 is a sectional view along line II-II of FIG. 1, referring to conventional power semiconductor device.
Figure 3:
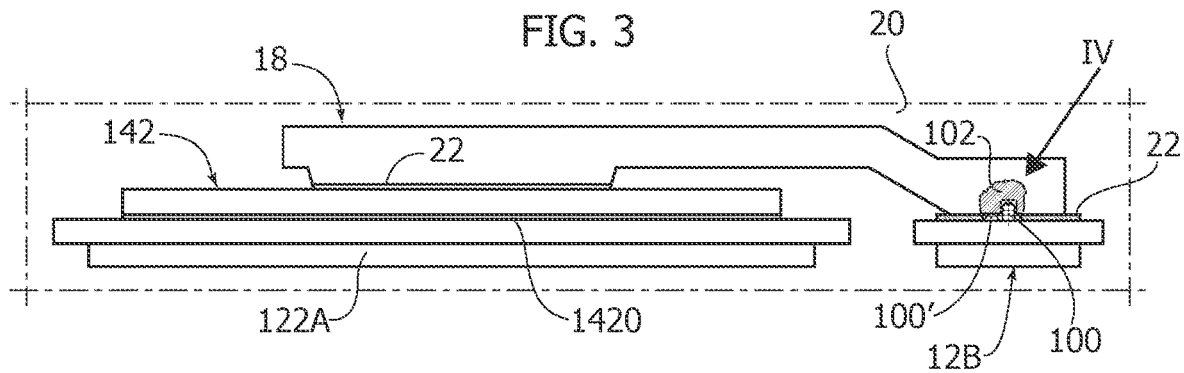
FIG. 3 is a sectional view along line II-II of FIG. 1, referring to a power semiconductor device according to embodiments of the present description.

FIG. 1 is exemplary of a power semiconductor device 10 with a plastic package.

As is conventional in the art, the device 10 comprises a substrate (leadframe) 12 having arranged thereon one or more semiconductor integrated circuit chips or dice. As used herein, the terms chip/chips and die/dice are regarded as synonymous.

The figures illustrate by way of example a semiconductor power device 10 comprising a low-power section (e.g., a controller integrated circuit die 141) attached on a first die pad 121A in the leadframe 12 and a high-power section (e.g., one or more power integrated circuit dice 142) attached on one or more die pads 122A in the lead frame 12, with an array of leads 12B around the die pads 121A, 122A having the dice 141 and 142 mounted thereon.

The designation "leadframe" (or "lead frame") is currently used (see, for instance the USPC Consolidated Glossary of the United States Patent and Trademark Office) to indicate a metal frame that provides support for an integrated circuit chip or die as well as electrical leads to interconnect the integrated circuit in the die or chip to other electrical components or contacts.

Essentially, a leadframe comprises an array of electrically-conductive formations (or leads, e.g., 12B) that from an outline location extend inwardly in the direction of a semiconductor chip or die (e.g., 141, 142) thus forming an array of electrically-conductive formations from a die pad (e.g., 121A, 122A) configured to have at least one semiconductor chip or die attached thereon. This may be via conventional means such as a die attach adhesive 1420 (a die attach film (DAF), for instance).

A device as illustrated in FIG. 1 is intended to be mounted on a substrate such as a printed circuit board (PCB—not visible in the figures), using solder material, for instance.

Electrically conductive formations are provided to electrically couple the semiconductor chip(s) 141, 142 to selected ones of the leads (outer pads) 12B in the leadframe 12.

As illustrated, these electrically conductive formations comprise wire bonding patterns 16 coupling the low-power section (chip 141) to selected ones of the leads 12B and to the high-power section (chip or chips 142). These wire bonding patterns 16 are coupled to die pads 1410 provided at the front or top surfaces of the chips 141 and 142.

Conversely, so-called clips 18 are used to couple the high-power section (chip or chips 142) to selected ones of the leads 12B acting as (power) output pads of the device 10.

Using clips 18 in the place of wires as included in the wire bonding patterns 16 (used to provide electrical coupling to a low-power section e.g., a controller 141) takes into account the fact that the current transferred from the high-power section 142 to the output pads in a power semiconductor device may be significant. As noted, wires such as the wires 16 are still used to provide electrical coupling to a low-power section (e.g., a controller) in the device.

An insulating encapsulation 20 (e.g., an epoxy resin) is molded on the assembly thus formed to complete the plastic body of the device 10.

While the device 10 as shown comprises two clips 18, certain devices may comprise just one clip or more than two clips.

As explained to this point, such a device structure is conventional in the art, which makes it unnecessary to provide a more detailed description herein.

To summarize, for the purposes herein, producing the device 10 as discussed herein involves: arranging at least one semiconductor chip 142 on a die pad 12A in a substrate 12 that comprises at least one electrically conductive pad 12B by (that is, adjacent or sidewise) the die pad 12A; and positioning at least one electrically conductive clip 18 in a bridge-like position between the at least one semiconductor chip 142 and the at least one electrically conductive pad 12B.

In such a bridge-like position, the electrically conductive clip 18 has coupling surfaces facing towards the semiconductor chip 142 and the electrically conductive pad 12B.

The electrically conductive clip 18 positioned in said bridge-like position is soldered to the semiconductor chip 142 and to the electrically conductive pad 12B to provide electrical coupling therebetween.

As illustrated, soldering is accomplished via soldering material 22 dispensed (in a manner known per se to those of skill in the art) at said coupling surfaces. The soldering material 22 is consolidated (in a manner likewise known per se to those of skill in the art), e.g., via heat treatment in an oven.

As discussed, clips such as the clip 18 are placed using a clip attach equipment and a solder paste 22 is used to connect the clip to pad and die. Solder curing in an oven is applied to provide a solid connection of the clips 18 to pad (e.g., 12B) and die (e.g., 142).

Conventional clip attachment equipment facilitates achieving an adequate accuracy in chip placement as a clip 18 is applied bridge-like between a die such as the die 142 and a respective pad/lead such as the pad/lead 12A: this case is considered for simplicity; in certain devices an individual clip 18 may be coupled, e.g., to plural pads/leads.

After clip placement, the assembly is transferred to an oven for solder curing. During this handling and curing process, clips may become displaced from a desired correct position, which may result in a defective final product.

The thickness of the solder 22 and the tendency of the clip to "float" on the solder 22 in a fluid state may also lie at the basis of undesired excessive clip tilt.

Undesired clip movement (displacement) can be attempted to be countered by adding fixing features in the clip and leadframe design.

Smooth handling may also help along with very accurate clip centering in clip placement.

Selecting solder paste materials countering undesired clip floating properties can also be considered.

None of these solutions appears fully satisfactory, for various reasons.

For instance, certain features added to the clip/leadframe design can be space-consuming, which may suggest reducing pad dimensions and/or using larger package dimensions to gain space, neither of which is attractive/desirable.

Handling of the parts involved is already a fairly gentle process and further improvements in that directions are hardly conceivable.

Selecting solder paste materials different from those conventionally used may have negative effects in terms of thermal and electrical performance.

Examples as considered herein take advantage from the current availability of equipment (e.g., wire bonding equipment) configured for forming so-called stud bumps in semiconductor device manufacturing processes.

In conventional wire bonding (as used to provide the wire bonding patterns 16 discussed previously, for instance) a ball is formed at an end of a wire metal material such as, e.g., aluminum (Al), copper (Cu), and gold (Au), which is bonded to a die pad. The wire is then extended towards a lead where a second wire bond is formed.

If the wire is terminated after the first bond, only a "bump" is formed on the die pad. Such a bump can be used to interconnect to a die that is flip-chipped onto a substrate using a thermo sonic or thermo compression process, for instance.

In examples as considered herein, one or more stud bumps 100 are formed on a pad/lead 12B to which a clip 18 is desired to be coupled. One or more corresponding recesses or cavities 102 are formed, e.g., as cylindrical (blind) holes in the clip 18 at the surface of the clip 18 facing the pad/lead 12B so that the bump or bumps 100 can penetrate into these recesses or cavities 102. The bump 100/cavity 102 pair may, for example, be located at a region 180 shown in FIG. 1.

Each bump 100/cavity 102 pair can thus provide a centering feature that counters undesired mutual displacement of the clip 18 with respect to the pad 12B (and with respect to the substrate 12 and the chip or chips 142).

A method as illustrated herein thus comprises, prior to soldering, providing at least one pair of complementary positioning formations such as a cavity 102 in the electrically conductive clip 18 and a protrusion 100 in the electrically conductive pad 12B.

The complementary positioning formations 100, 102 become mutually engaged in response to the electrically conductive clip 18 being positioned in the desired bridge-like position.

The complementary positioning formations 100, 102 thus maintain the clip 18 in such a bridge-like position during the soldering process (solder paste delivered and consolidated, e.g., via heat curing in an oven) countering undesired displacement and "floating" onto the solder paste in molten state.

Figure 6:
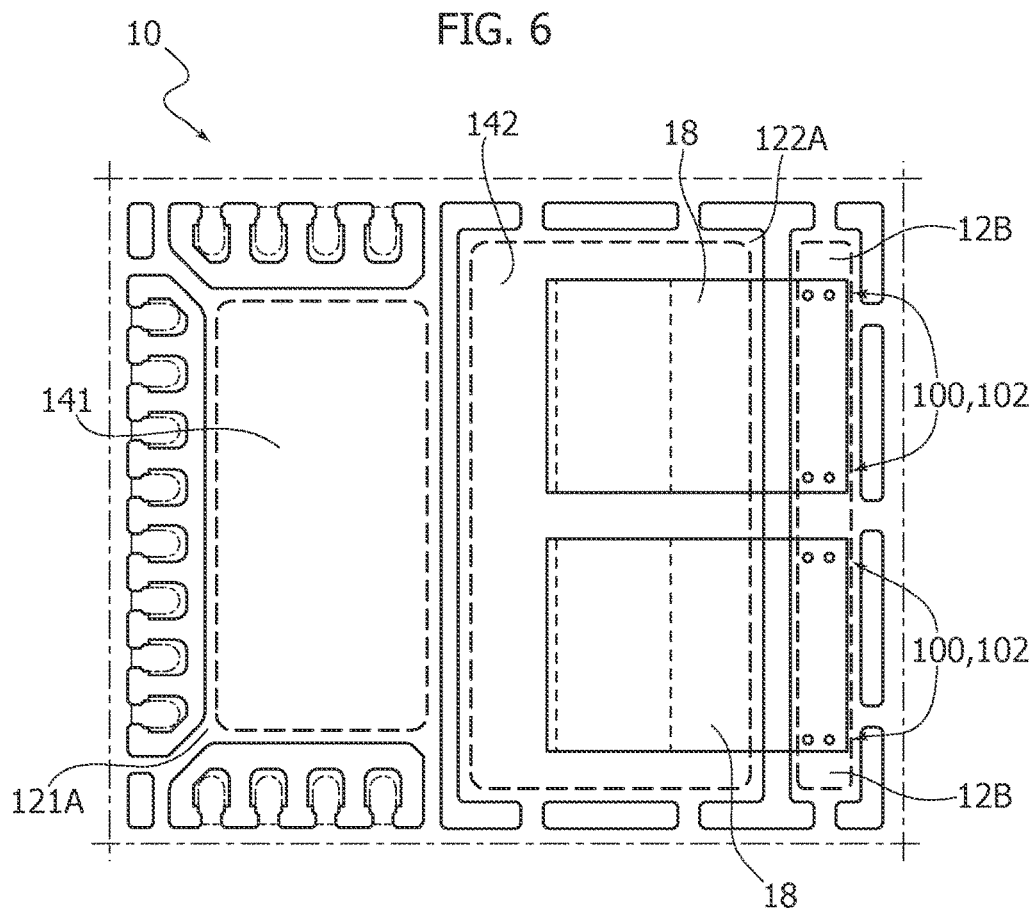
FIG. 6 is a plan view of a power semiconductor device according to embodiments of the present description.

Providing at least two bump 100/cavity 102 pairs in the or each clip (see FIG. 6, for instance) advantageously counters mutual rotation of the clip 18 with respect to the pad 12B, the substrate 12 and the chip(s) 142.

Stud bumps such as the stud bump 100 can be created and bonded on the pad 12B using otherwise conventional wire bonding technology using, e.g., gold or (less expensive) copper material.

Recesses or cavities 120 on a clip 18 can be created while producing the clips, e.g., during clip stamping (of metal material such, e.g., copper) to bestow thereon a desired shape.

Figure 4:
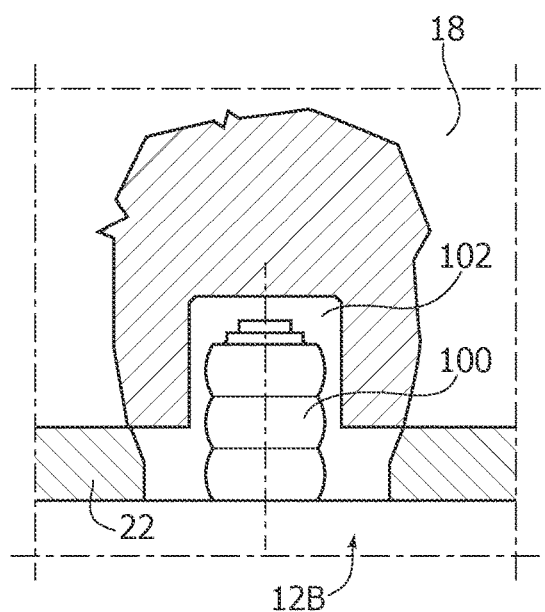
FIG. 4 is a view of the portion of FIG. 3 indicated by arrow IV, reproduced on an enlarged scale.
Figure 5:
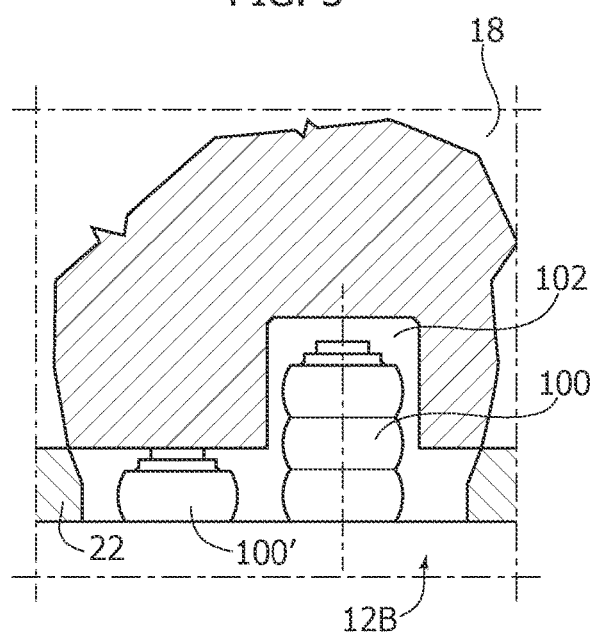
FIG. 5 is a view corresponding to FIG. 4 illustrative of a possible advantageous development of embodiments of the present description.

As visible in FIGS. 4 and 5, a plurality of piled/stacked stud bumps 100 can be created to provide anchoring "pillars" configured to penetrate some length into respective recesses 102 (e.g., up to the end surface of the recess 102).

As illustrated in FIG. 5, one or more "spacer" stud bumps 100' can be formed having no recess counterpart in the clip 18 to keep the clip 18 (slightly) distanced from the pad 12B to provide a gap of controlled width between the clip 18 and the pad 12A.

Such a gap can be penetrated by solder material 22. This arrangement was found to be beneficial in controlling (minimum) solder thickness and countering undesired clip tilt.

Examples as presented herein facilitate maintaining a precise clip "centering" during assembly processes, thus countering undesired displacement (translation, rotation, tilting). Solder thickness can be adequately controlled.

In examples as presented herein, positioning formations 100 such as stud bumps are formed protruding from a pad/lead 12B in a leadframe 12 and engaging a respective cavity 102 (e.g., a blind hole) in the clip 18.

At least in principle, such positioning formations 100 could be formed also or only at die pads such as the die pads 1410 provided (as otherwise conventional in the art) at the front or top surface of a chip or die such as the chip or die 142.

Also, spacer stud bumps such as the stud bump 100' illustrated in the figures could be provided also (or only) on the surface of the clip 18.

It is noted that the presence of the anchoring formation(s) 100 protruding from a pad/lead and engaging a respective cavity 102 (e.g., a blind hole) in the clip 18 will be noticeable also in the final device, that is even after solder material 22 is provided between the clip 18 and the pad 12B to which the clip is soldered.

Without prejudice to the underlying principles, the details and embodiments may vary, even significantly, with respect to what has been described by way of example only without departing from the extent of protection.

The claims are an integral part of the technical teaching on the embodiments as provided herein.

The extent of protection is determined by the annexed claims.

The invention claimed is:

1. A method, comprising:
   arranging a semiconductor integrated circuit chip on a die pad of a substrate, the substrate comprising an electrically conductive pad by the die pad;
   providing a cavity in an electrically conductive clip;
   using a wirebonding process to form a stack of wire-terminated bumps at a position in at least one of the semiconductor integrated circuit chip or the electrically conductive pad;

positioning the at least one electrically conductive clip in a bridge-like position between the semiconductor integrated circuit chip and the electrically conductive pad with the stack of wire-terminated bumps mutually engaging the cavity;

wherein the electrically conductive clip, in said bridge-like position, has coupling surfaces facing towards the semiconductor integrated circuit chip and the electrically conductive pad; and soldering the electrically conductive clip in said bridge-like position to the semiconductor integrated circuit chip and to the electrically conductive pad to provide electrical coupling therebetween, wherein soldering is via soldering material at said coupling surfaces.

2. The method of claim 1, wherein the stack of wire-terminated bumps mutually engaging the cavity forms a pair of complementary positioning formations, further comprising providing at least two pairs of complementary positioning formations, wherein the at least two pairs of complementary positioning formations counter rotation of the at least one electrically conductive clip with respect to said bridge-like position during said soldering.

3. The method of claim 1, wherein the cavity comprises a blind hole.

4. The method of claim 1, further comprising, prior to said soldering, using the wirebonding process to form a single wire-terminated bump providing a spacer formation on at least one of the semiconductor integrated circuit chip and the electrically conductive pad at a further position located spaced apart from said position, wherein said spacer formation is configured to maintain the electrically conductive clip at a distance from one or more of the semiconductor integrated circuit chip and the electrically conductive pad during said soldering.

5. A device, comprising:

a substrate comprising an electrically conductive pad by a die pad;

a semiconductor integrated circuit chip mounted to the die pad of the substrate;

an electrically conductive clip positioned in a bridge-like position between semiconductor integrated circuit chip and the electrically conductive pad, the electrically conductive clip having coupling surfaces facing towards the semiconductor integrated circuit chip and the electrically conductive pad;

solder material applied at said coupling surfaces of the electrically conductive clip in said bridge-like position, the solder material electrically coupling the electrically conductive clip to the semiconductor integrated circuit chip and to the electrically conductive pad; and a pair of complementary positioning formations including a cavity in the electrically conductive clip and a stack of bumps comprising wire-terminated bonding wire material at a position in at least one of the semiconductor integrated circuit chip and the electrically conductive pad, the stack of wire-terminated bumps mutually engaging the cavity.

6. The device of claim 5, further comprising a further pair of complementary positioning formations.

7. The device of claim 5, wherein the cavity comprises a blind hole.

8. The device of claim 5, further comprising a bump comprising wire-terminated bonding wire material providing a spacer formation on at least one of the semiconductor integrated circuit chip and the electrically conductive pad at a further position spaced apart from said position, wherein said spacer formation is configured to maintain the electrically conductive clip at a distance from the semiconductor integrated circuit chip and the electrically conductive pad.

9. The device of claim 5, wherein the semiconductor integrated circuit chip is a power semiconductor integrated circuit with the electrically conductive clip sized and dimensioned to carry currents produced by the power semiconductor integrated circuit.

* * * * *